(12) United States Patent
Akagawa et al.

(10) Patent No.: US 10,903,399 B2
(45) Date of Patent: Jan. 26, 2021

(54) METHOD FOR MANUFACTURING A LIGHT EMITTING DEVICE COMPRISING AT LEAST TWO FIRST LIGHT EMITTING DIODES AND A SECOND LIGHT EMITTING DIODES INTERPOSED THEREBETWEEN

(71) Applicant: NICHIA CORPORATION, Anan (JP)

(72) Inventors: Seitaro Akagawa, Komatsushima (JP); Kazuki Koda, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 15/720,346

(22) Filed: Sep. 29, 2017

(65) Prior Publication Data
US 2018/0097152 A1    Apr. 5, 2018

(30) Foreign Application Priority Data
Sep. 30, 2016 (JP) ................................ 2016-193488

(51) Int. Cl.
| H01L 33/50 | (2010.01) |
| H01L 25/075 | (2006.01) |
| H01L 33/48 | (2010.01) |
| H01L 33/62 | (2010.01) |

(52) U.S. Cl.
CPC ........ H01L 33/504 (2013.01); H01L 25/0753 (2013.01); *H01L 33/486* (2013.01); *H01L 33/62* (2013.01); *H01L 2224/48137* (2013.01); *H01L 2224/48247* (2013.01); *H01L 2933/0041* (2013.01)

(58) Field of Classification Search
CPC ............. H01L 2924/181; H01L 33/504; H01L 25/0753; H01L 33/502; H01L 33/50; C09K 11/7734

USPC .... 438/28; 257/88, 89, 98, E25.02, E33.061
See application file for complete search history.

(56) References Cited

U.S. PATENT DOCUMENTS

| 2007/0001188 A1 | 1/2007 | Lee |
| 2007/0126011 A1 | 6/2007 | Lee |
| 2011/0291114 A1 | 12/2011 | Cheng |
| 2013/0020929 A1* | 1/2013 | van de Ven ......... H01L 25/0753 313/498 |

(Continued)

FOREIGN PATENT DOCUMENTS

| JP | 2007036030 A | 2/2007 |
| JP | 2007507910 A | 3/2007 |

(Continued)

*Primary Examiner* — David Chen
(74) *Attorney, Agent, or Firm* — Hunton Andrews Kurth LLP

(57) ABSTRACT

A method for manufacturing a light emitting device includes: mounting a first light emitting element whose emission peak wavelength is in a range of 430 nm to 490 nm and a second light emitting element whose emission peak wavelength is in a range of 490 nm to 570 nm; and providing a light transmitting member including a red phosphor and at least one of a green phosphor of which a half width of an emission spectrum is not more than 45 nm and a blue phosphor of which a half width of an emission spectrum is not more than 60 nm. The step of providing the light transmitting member includes adding at least one of a predetermined amount of the green phosphor and a predetermined amount of the blue phosphor based on the emission peak wavelength of the second light emitting element.

20 Claims, 6 Drawing Sheets

(56) References Cited

U.S. PATENT DOCUMENTS

| | | | | |
|---|---|---|---|---|
| 2014/0191271 A1* | 7/2014 | Maeno | ................... | H01L 33/50 |
| | | | | 257/98 |
| 2014/0225060 A1* | 8/2014 | Okuno | ................... | H01L 33/06 |
| | | | | 257/13 |
| 2014/0295535 A1* | 10/2014 | Kitahara | ............ | G02B 21/0096 |
| | | | | 435/288.7 |
| 2015/0270449 A1* | 9/2015 | Park | ..................... | H01L 33/504 |
| | | | | 257/98 |
| 2015/0295144 A1 | 10/2015 | Weiler et al. | | |
| 2016/0049560 A1* | 2/2016 | Oh | ........................ | H01L 33/504 |
| | | | | 257/98 |
| 2016/0149094 A1* | 5/2016 | Onuma | ................... | H01L 33/56 |
| | | | | 257/89 |
| 2016/0233387 A1* | 8/2016 | Kitano | ................. | C09K 11/617 |
| 2016/0240750 A1 | 8/2016 | Moon | | |
| 2016/0254421 A1 | 9/2016 | Reiherzer | | |
| 2017/0040301 A1* | 2/2017 | Yamamoto | .............. | H01L 33/62 |

FOREIGN PATENT DOCUMENTS

| | | | |
|---|---|---|---|
| JP | 2007158296 | A | 6/2007 |
| JP | 2009289957 | A | 12/2009 |
| JP | 2011222665 | A | 11/2011 |
| JP | 2011249751 | A | 12/2011 |
| JP | 2015233048 | A | 12/2015 |
| JP | 2016503579 | A | 2/2016 |
| JP | 2016152413 | A | 8/2016 |

* cited by examiner

METHOD FOR MANUFACTURING A LIGHT EMITTING DEVICE COMPRISING AT LEAST TWO FIRST LIGHT EMITTING DIODES AND A SECOND LIGHT EMITTING DIODES INTERPOSED THEREBETWEEN

CROSS-REFERENCE TO RELATED APPLICATION

This application claims priority to Japanese Patent Application No. 2016-193488, filed on Sep. 30, 2016, the disclosure of which is hereby incorporated by reference in its entirety.

BACKGROUND

The present disclosure relates to a light emitting device and a manufacturing method of the light emitting device.

In general, a light emitting device employing a light emitting element, such as a light emitting diode, has been widely used as various types of light sources, such as backlights for liquid crystal displays, and lighting devices including LED bulbs, LED lamps, ceiling lights, and the like. For example, a light emitting device disclosed in Japanese Patent Publication No. 2007-158296 includes a red phosphor, a light emitting element configured to emit blue light, and a light emitting element configured to emit green light. Japanese Patent Publication No. 2007-158296 discloses that this enables the light emitting device to achieve high color reproducibility when used as a light emitting device in a backlight of a liquid crystal display.

SUMMARY

In the light emitting device disclosed in Japanese Patent Publication No. 2007-158296, the blue component and the green component of light emitted from the light emitting device are unambiguously determined according to the emission spectra of the blue light emitting element and the green light emitting element and, therefore, there is a probability that it is difficult to adjust the chromaticity of the light emitting device.

In view of the foregoing, one embodiment of the present disclosure provides a manufacturing method of a light emitting device whose chromaticity is easily adjustable. Another embodiment of the present disclosure provides a light emitting device which is capable of realizing high color reproducibility when used in a backlight of a liquid crystal display.

According to an embodiment of the present disclosure, a method for manufacturing a light emitting device comprises: mounting a first light emitting element and a second light emitting element, the first light emitting element having an emission peak wavelength in a range of not less than 430 nm and less than 490 nm, and the second light emitting element having an emission peak wavelength in a range of not less than 490 nm and not more than 570 nm; and providing a light transmitting member in such a manner as to cover the first light emitting element and the second light emitting element, the light transmitting member containing a red phosphor and at least one of a green phosphor of which a half width of an emission spectrum is not more than 45 nm, and a blue phosphor of which a half width of an emission spectrum is not more than 60 nm. The step of providing the light transmitting member includes adding at least one of a predetermined amount of the green phosphor and a predetermined amount of the blue phosphor based on the emission peak wavelength of the second light emitting element.

The present disclosure also provides a light emitting device, comprising: a package; a first light emitting element having an emission peak wavelength in a range of not less than 430 nm and less than 490 nm; a second light emitting element having an emission peak wavelength in a range of not less than 490 nm and not more than 570 nm; and a light transmitting member covering the first light emitting element and the second light emitting element, the light transmitting member containing a red phosphor and at least one of a green phosphor and a blue phosphor. The first light emitting element and the second light emitting element may be mounted to an upper surface of the package. The green phosphor may be an aluminate phosphor whose composition includes a first element which includes one or more elements selected from Ba and Sr, and a second element which includes Mg and Mn The blue phosphor is an alkaline earth halogen apatite phosphor.

Certain embodiment of the present disclosure can provide a manufacturing method of a light emitting device whose chromaticity is easily adjustable.

Certain embodiment of the present disclosure can provide a light emitting device which can realize high color reproducibility when used in a backlight of a liquid crystal display.

DETAILED DESCRIPTION OF EMBODIMENTS

Figure 1A:
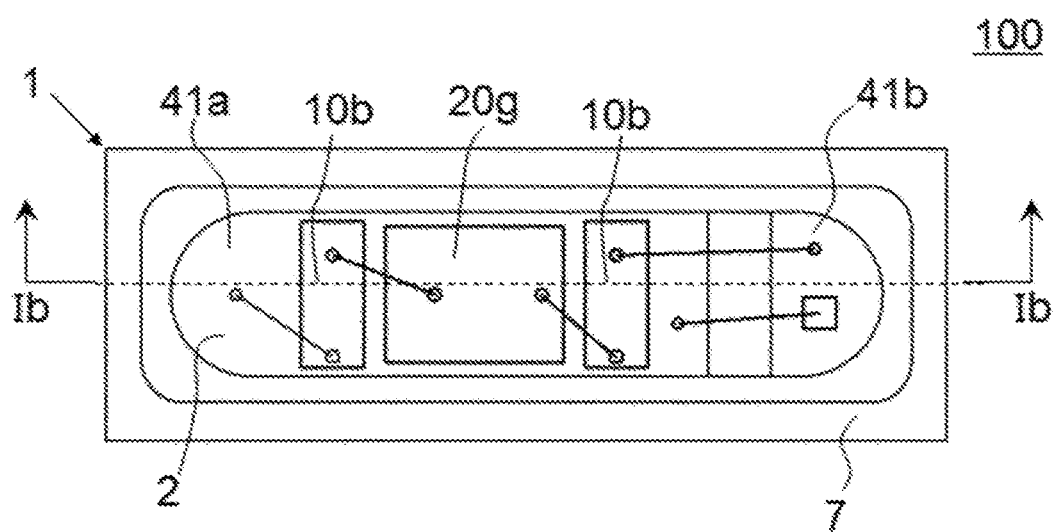
FIG. 1A is a schematic top view showing a light emitting device 100 according to an embodiment of the present disclosure.

Hereinafter, embodiments will be described in detail based on the drawings. Portions designated by the same reference numeral in multiple drawings refer to an identical or similar portion or component or to equivalent portions or components. The following description intends to illustrate a light emitting device for embodiments of the technical/technological concept of the present disclosure. The present disclosures does not intend to limit the present invention to the following description. Unless particularly specified, the dimensions, materials, shapes, relative arrangements, etc., of constituent components are merely exemplary, to which the scope of the present invention is not limited. The sizes, relative positions, etc., of members shown in the drawings are sometimes exaggerated for easy understanding or any other reasons. Note that the relationship between the color names and the chromaticity coordinates and the relationship between the wavelength ranges of light and the color names of monochromatic light comply with JIS Z8110.

Figure 1B:
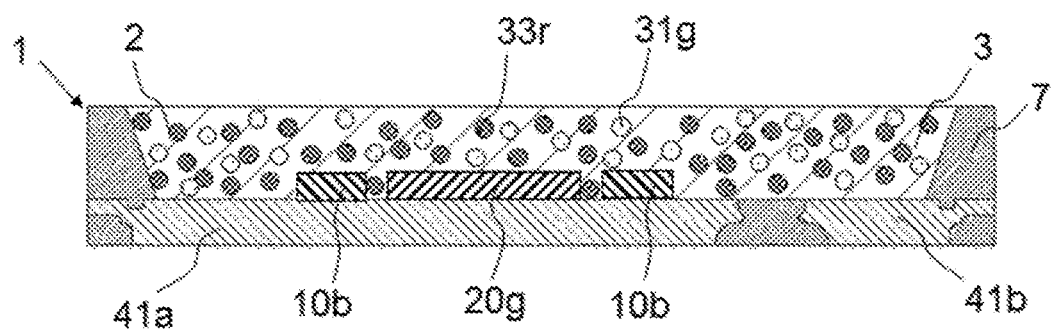
FIG. 1B is a schematic cross-sectional view showing a cross section taken along line Ib-Ib in FIG. 1A.
Figure 2:
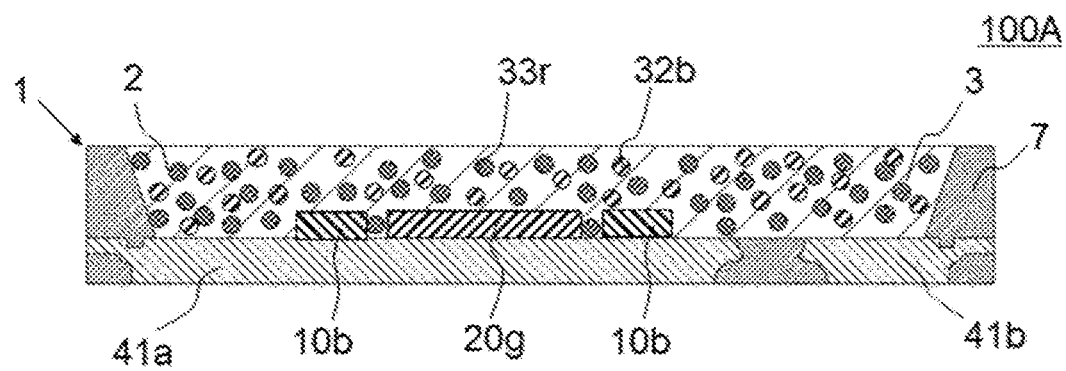
FIG. 2 is a schematic cross-sectional view showing a light emitting device 100A according to an embodiment of the present disclosure.

FIG. 1A is a schematic top view showing a light emitting device 100 according to an embodiment of the present disclosure. FIG. 1B is a schematic cross-sectional view showing a cross section taken along line Ib-Ib of FIG. 1A. FIG. 2 is a schematic cross-sectional view showing a light emitting device 100A according to an embodiment of the present disclosure. The schematic top view of the light emitting device 100A is substantially to the same as the schematic top view of FIG. 1A and is therefore not provided herein. In FIG. 1A, phosphors and some other components are not shown for the sake of easy recognition of the first light emitting elements 10b and the second light emitting element 20g provided in the light transmitting member 3. In FIG. 1B and FIG. 2, wires and some other components are not shown for the sake of easy recognition of the phosphors.

The light emitting devices 100 and 100A include a package 1, first light emitting elements 10b, a second light emitting element 20g, and a light transmitting member 3. The light transmitting member 3 includes a red phosphor 33r and at least one of a green phosphor 31g and a blue phosphor 32b. The light emitting device 100 shown in FIG. 1B is an exemplary light emitting device in which the light transmitting member 3 contains the green phosphor 31g and the red phosphor 33r. The light emitting device 100A shown in FIG. 2 is an exemplary light emitting device in which the light transmitting member 3 contains the blue phosphor 32b and the red phosphor 33r. The light transmitting member 3 may include both the green phosphor 31g and the blue phosphor 32b.

The package 1 is a member to which the first light emitting elements 10b and the second light emitting element 20g are mounted. The package 1 can be a resin package in which a lead and a resin portion are integrally formed, a ceramic substrate which includes electrode layers, or the like. The package 1 preferably includes a recessed portion for housing the light emitting elements, so that light emitted from the light emitting elements can be efficiently extracted.

The first light emitting element 10b is a blue light emitting element whose emission peak wavelength is in the range of not less than 430 nm and less than 490 nm (the wavelength range of the blue region). It is particularly preferred that the emission peak wavelength of the first light emitting elements 10b is in the range of not less than 440 nm and not more than 460 nm. The second light emitting element 20g is a green light emitting element whose emission peak wavelength is in the range of not less than 490 nm and not more than 570 nm (i.e., the wavelength range of the green region). It is particularly preferred that the emission peak wavelength of the second light emitting element 20g is in the range of not less than 515 nm and not more than 540 nm.

Each of the first light emitting element 10b and the second light emitting element 20g is preferably a light emitting element whose half width is not more than 40 nm, more preferably a light emitting element whose half width is not more than 30 nm. Accordingly, in the emission spectrum of the light emitting device 100, the blue component and the green component can easily have a sharp peak, so that a blue or green component of high purity can be transmitted through the color filter of the liquid crystal backlight. As a result, a liquid crystal display which includes the light emitting device 100 can achieve high color reproducibility.

The light emitting device 100 shown in FIGS. 1A and 1B includes two first light emitting elements 10b and one second light emitting element 20g. The two first light emitting elements 10b and the one second light emitting element 20g are arranged side by side. Being arranged side by side means that three light emitting elements are in a linear arrangement. In other words, it means that the light emitting elements are arranged such that lateral sides of adjacent light emitting elements at least partially face each other.

The second light emitting element 20g is interposed between the two first light emitting elements 10b. The first light emitting element 10b on the left-hand side in the drawing, the interposed second light emitting element 20g, and the first light emitting element 10b on the right-hand side in the drawing are connected in series. When employing a configuration in which two light emitting elements emitting the same color light sandwich a light emitting element having a different color light, good color mixture of light can be realized by emission from the respective light emitting elements and light from the phosphors excited by the light emitted from the light emitting elements. As a result, color non-uniformity of the light emitting device can be mitigated.

Figure 3:
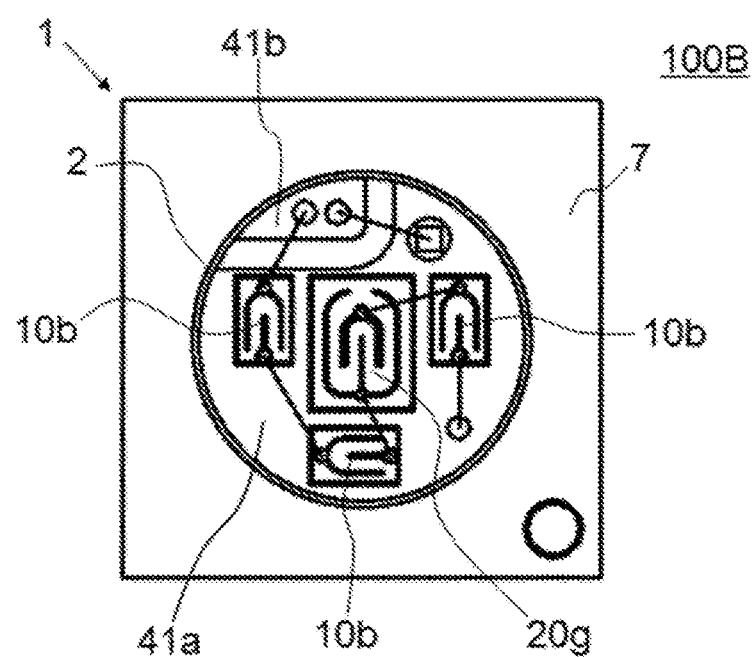
FIG. 3 is a schematic top view showing a light emitting device 100B according to an embodiment of the present disclosure.

An alternative arrangement of the first light emitting elements 10b and the second light emitting element 20g is shown in FIG. 3. The light emitting device 100B shown in FIG. 3 includes three first light emitting elements 10b and one second light emitting element 20g. The second light emitting element 20g is surrounded by three first light emitting elements 10b. The first light emitting element 10b on the right-hand side in the drawing, the second light emitting element 20g at the center, the first light emitting element 10b on the lower side of the second light emitting element 20g, and the first light emitting element 10b on the left-hand side in the drawing are connected in series. With such a configuration that the second light emitting element 20g is surrounded by three first light emitting elements 10b, good color mixture of light can be realized by emission from each light emitting element and light from a phosphor excited by the light emitted from the light emitting element. As a result, color non-uniformity of the light emitting device can be mitigated.

The arrangement of first light emitting elements 10b and the second light emitting element 20g can be appropriately determined other than the above-mentioned arrangements. The light emitting device may employ a configuration that a single first light emitting element 10b and a single second light emitting element 20g are used. Alternatively, the light emitting device may include a plurality of first light emitting elements 10b and a plurality of second light emitting elements 20g. By adjusting the arrangement or number of the light emitting elements, a light emitting device having a desired color tone or light amount can be obtained.

The ratio of the optical output of the second light emitting element 20g to the optical output of the first light emitting element 10b is preferably not less than 0.3 and not more than 0.7. The ratio of the sum of the optical outputs of the second light emitting elements 20g to the sum of the optical outputs of the first light emitting elements 10b is preferably not less than 0.2 and not more than 0.6. These ratios enable provision of a light emitting device which has good color reproducibility. The optical output of the first light emitting element 10b may be equal to the optical output of the second light emitting element 20g.

In this specification, the "optical output" refers to the radiant flux of JIS Z 8113. The ratio of the optical outputs of the light emitting elements can be obtained by measuring the emission spectra by a spectrophotometer and calculating the ratio between the integrals of the emission spectra of the blue light emitting element and the green light emitting element. The optical output of a light emitting element is determined depending on the emission peak wavelength of the light emitting element, the planar area of the light emitting element, or the type of a semiconductor multilayer structure of the light emitting element.

The light emitting device 100 includes a light transmitting member 3 containing the red phosphor 33r and at least one of the green phosphor 31g and the blue phosphor 32b. The light transmissive member 3 covers the first light emitting elements 10b and the second light emitting element 20g. In the light emitting device 100 shown in FIGS. 1A and 1B, the green phosphor 31g and the red phosphor 33r are contained in a resin which is the major constituent material of the light transmitting member 3.

The green phosphor 31g may be a green phosphor of which the half width of the emission spectrum is not more than 45 nm, preferably a green phosphor of which the half width of the emission spectrum is not more than 40 nm. By using such a green phosphor 31g, high color reproducibility can be realized in a light emitting device used for a backlight of a liquid crystal display. As for the chromaticity (particularly, the y value of the chromaticity) of the light emitting device 100, it can be easily made closer to desired chromaticity by adjusting the amount of the added green phosphor 31g. One of the examples of such a green phosphor 31g is an aluminate phosphor whose composition includes a first element and a second element. The first element includes one or more elements selected from Ba and Sr. The second element includes Mg and Mn.

The blue phosphor 32b is a blue phosphor of which the half width of the emission spectrum is not more than 60 nm. The blue phosphor 32b is more preferably a blue phosphor of which the half width of the emission spectrum is not more than 50 nm. The blue phosphor 32b is preferably a phosphor which is capable of absorbing shorter wavelengths of the blue light emitting element (e.g., wavelengths of not more than 435 nm). By using such a blue phosphor 32b, high color reproducibility can be realized in a light emitting device used for a backlight of a liquid crystal display. As for the chromaticity (particularly, the y value of the chromaticity) of the light emitting device 100, it can be made closer to desired chromaticity by adjusting the amount of the added blue phosphor 32b. It is capable of absorbing shorter wavelengths of the blue light emitting element, therefore the shorter wavelengths which can affect human eyes (e.g., wavelengths of not more than 435 nm) can be removed while the color reproducibility of the light emitting device 100 is maintained. One of the examples of such a blue phosphor 32b is an alkaline earth halogen apatite phosphor.

As in the light emitting device 100 and the light emitting device 100A, the light transmitting member 3 may contain either one of the green phosphor 31g or the blue phosphor 32b, in addition to the red phosphor 33r. This can reduce the possibility that fluorescent light emitted from one phosphor is absorbed by the other phosphor. Accordingly, a light emitting device can exhibit good light extraction.

The light transmitting member 3 may contain both the green phosphor 31g and the blue phosphor 32b. This can increase the color reproducibility of the light emitting device 100. Further, the shorter wavelengths which can affect human eyes (e.g., wavelengths of not more than 435 nm) can be removed.

The red phosphor 33r used is a red phosphor of which the half width of the emission spectrum is not more than 15 nm, preferably a red phosphor of which the half width of the emission spectrum is not more than 10 nm. By using such a red phosphor 33r, high color reproducibility can be realized in a light emitting device used for a backlight of a liquid crystal display.

The red phosphor 33r is preferably selected from red phosphors which can be excited by blue light from the first light emitting elements 10b while not substantially be excited by green light from the second light emitting element 20g. As described above, the red phosphor 33r is a phosphor which is less likely to absorb green light, i.e., a phosphor which is less likely to convert wavelength of green light, thereby facilitating designing of the light emitting device. Examples of such a red phosphor 33r include red phosphors such as $K_2SiF_6:Mn^{4+}$, $K_2(Si,Ge)F_6:Mn^{4+}$, and $K_2TiF_6:Mn^{4+}$.

The light emitting device 100 may be manufactured by a manufacturing method described below. The manufacturing method of the light emitting device 100 includes mounting the first light emitting elements 10b and the second light emitting element 20g to the package 1, and providing the light transmitting member 3 in such a manner as to cover the first light emitting element and the second light emitting element.

The manufacturing method of the light emitting device 100 is described with an example where the package 1 is a resin package in which leads 41 and a resin portion 7 are integrally formed.

Figure 4A:
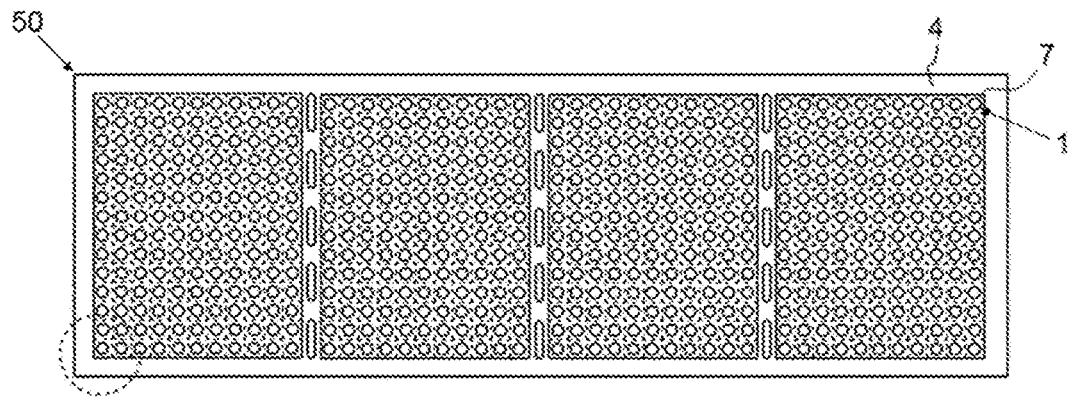
FIG. 4A is a schematic top view showing a mounting board block 50 according to an embodiment of the present disclosure.
Figure 4B:
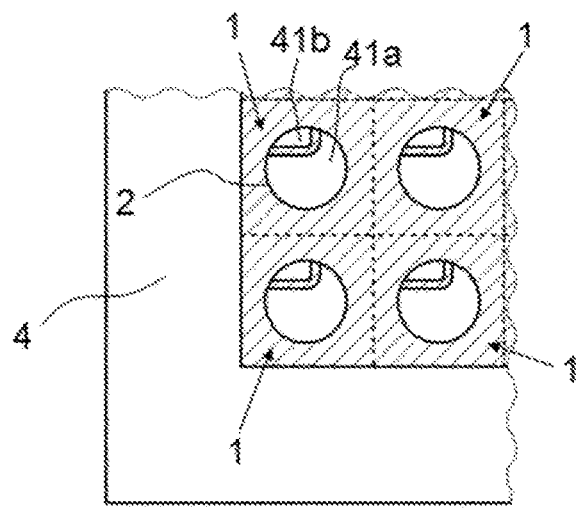
FIG. 4B is a partially-enlarged view of a portion of FIG. 4A encircled with a broken line.

FIG. 4A is a schematic top view showing a lead frame with a resin mold (mounting board block 50) according to an embodiment of the present disclosure. FIG. 4B is a partially-enlarged view of a portion encircled with a broken line in FIG. 4A. The lead frame with a resin mold includes a plurality of packages 1 which have recessed portions 2 on the upper side of the packages. At the bottom surface of the recessed portions 2, a section is partially exposed. The partially exposed part is to be a lead 41 after the substrate is cut into separate pieces.

As shown in FIGS. 4A and 4B, a mounting board block 50 is prepared which includes the plurality of packages 1. The mounting board block 50 includes a lead frame 4 and a resin portion 7. In this specification, even before the mounting board block 50 is cut into separate pieces, regions or members which are to be the packages 1 are also referred to as "package" as they generally are referred to after the mounting board block 50 is cut into separate pieces.

The lead frame 4 includes a plurality of pairs of leads 41. Each pair of leads 41 includes a first lead 41a and a second lead 41b. The lead frame 4 may have irregular surfaces which is formed by processing, such as etching, pressing, or the like. Such irregular surfaces can improve adhesion between the lead frame 4 and the resin portion 7.

Then, the lead frame 4 is pressed between an upper die, which has projections, and a lower die of a mold. Regions which are pressed by the projections of the upper die correspond to recessed portions 2 of the light emitting device 100. Regions which are not pressed by the projections become space, in which the resin portion 7 is to be formed. Then, a resin is injected into the mold which includes the space, whereby the resin portion 7 is formed integrally with the lead frame 4, resulting in a lead frame with a resin mold. The method for forming the resin portion 7 using the mold can be realized by various molding methods, such as a transfer mold method, an injection molding method, a compression molding method, etc.

The mounting board block 50 may be obtained by, for example, purchasing a ready-made mounting board block. The present embodiment discloses the plurality of packages 1 formed in the mounting board block 50, however, a single package 1 can be provided, for example.

Then, the first light emitting elements 10b and the second light emitting element 20g are mounted at the bottom surface of the recessed portion 2 of the package 1. At the bottom surface of the recessed portion 2, the upper surfaces of the first lead 41a and the second lead 41b are exposed. The first light emitting elements 10b and the second light emitting element 20g are mounted to the upper surface of the first lead 41a via a bonding member.

Then, a light transmitting member 3 is provided inside the recessed portions 2 of the package 1 in such a manner as to cover the first light emitting elements 10b and the second light emitting element 20g. The light transmitting member 3 contains a red phosphor 33r and at least one of a green phosphor 31g of which the half width of the emission spectrum is not more than 45 nm, and a blue phosphor 32b of which the half width of the emission spectrum is not more than 60 nm. A predetermined amount of the green phosphor 31g and a predetermined amount of the blue phosphor 32b are added based on the emission peak wavelength of the second light emitting element 20g.

It is known that, when the second light emitting element 20g is configured with a nitride semiconductor containing indium in a light emitting layer, the emission peak wavelength of the second light emitting element 20g is likely to involve variance depending on the amount of added indium in manufacture. It is also known that, on the 1931 CIE chromaticity diagram, the y value of the chromaticity of the light emitting device is increased after transmitted through the color filter due to increase in the green component or reduction in the blue component of the light emitting device before transmitted through the color filter.

Thus, in the plurality of manufactured second light emitting elements 20g, even when the emission peak wavelength of the second light emitting elements 20g is in a wide range, a desired chromaticity of the light emitting device after the passage through the color filter can be achieved by adding a predetermined amount of the green phosphor 31g and/or a predetermined amount of the blue phosphor 32b. Specifically, when a predetermined amount of the green phosphor 31g is added, the green component of the light emitting device 100 increases, and the y value of the chromaticity of the light emitting device after the passage through the color filter increases. By adding a predetermined amount of the blue phosphor 32b that absorbs shorter wavelengths of the blue light emitting element, the blue component of the light emitting device 100 decreases, and the y value of the chromaticity of the light emitting device after the passage through the color filter increases. The x value of the chromaticity of the light emitting device after the passage through the color filter can be adjusted by changing the amount of the added red phosphor 33r.

The amount of the added green phosphor 31g and/or the amount of the added blue phosphor 32b is preferably determined in advance according to the combination of the first light emitting element 10b and the second light emitting element 20g. Specifically, it is preferred that a manual is prepared in which the predetermined amounts of the added green phosphor 31g and/or the predetermined amounts of the added blue phosphor 32b correspond to the combinations of the first light emitting element 10b and the second light emitting element 20g which are classified in ranks for respective emission peak wavelengths. This enables simplification of the process and to suppress variations in manufacture. For this purpose, before mounting the first light emitting element 10b and the second light emitting element 20g to the package, the emission peak wavelengths may be measured for each of the first light emitting elements 10b and the second light emitting elements 20g or for each production lots of the first light emitting elements 10b and the second light emitting elements 20g.

To adjust the chromaticity of the manufactured light emitting device, an additional transmissive member containing the green phosphor 31g and/or the blue phosphor 32b may be applied. Specifically, a light transmitting member 3 which contains a phosphor is provided to the package 1 to which the first light emitting elements 10b and the second light emitting element 20g is mounted. Then, the chromaticity of the resultant light emitting device is measured, and if adjustment of the chromaticity is further necessary, a still additional light transmissive member which contains the green phosphor 31g and/or the blue phosphor 32b is further applied. This enables easy adjustment of the chromaticity of the light emitting device. The additional light transmissive member may contain any other color of phosphor, such as a red phosphor, in addition to the green phosphor 31g and the blue phosphor 32b.

Then, the mounting board block 50 is cut into separate pieces, whereby a plurality of light emitting devices 100 are obtained.

According to the above-described manufacturing method, a light emitting device manufacturing method can be provided in which the chromaticity of the light emitting device is easily adjustable. Also, a light emitting device can be obtained which is capable of realizing high color reproducibility when used in a backlight of a liquid crystal display.

Hereinafter, a package and the components of a light emitting device of the present disclosure are described.

Package

The package 1 is a member to which the first light emitting elements 10b and the second light emitting element 20g are to be mounted, and includes terminals (i.e., leads) for power supply from an external device. The package 1 can be a resin package and a supporting base. In the resin package, a resin portion and leads are integrally formed. The supporting base includes a connection terminal provided on the surface of an insulative substrate that is configured with ceramic, glass, or a composite material thereof.

Resin Portion

The resin portion 7 is a member which is the major part of the resin package, and constitutes part of the exterior of the resin package. For the resin material of the major material of the resin portion 7, a thermosetting resin, a thermoplastic resin, or the like, can be used. Examples of the thermosetting resin include epoxy resins, silicone resins, polybismaleimide triazine resins, polyimide resins, polyurethane resins, and unsaturated polyester resins. Among these examples, either one of the epoxy resins, the silicone resins and the unsaturated polyester resins are preferred. Examples of the thermoplastic resin include aliphatic polyamide resins, half-aromatic polyamide resins, aromatic polyphthalamide resins, polycyclohexylene dimethylene terephthalate, polyethylene terephthalate, polycyclohexane terephthalate, liquid crystalline polymers, and polycarbonate resins. Among these examples, either one of the aliphatic polyamide resins, polycyclohexane terephthalate, polycyclohexylene dimethylene terephthalate are preferred. The aforementioned resin materials include denatured resins and hybrid resins thereof.

From the viewpoint of improving light extraction efficiency of the light emitting device, it is preferred that the resin portion 7 contains a white pigment. Examples of the material of the white pigment include titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, and zirconium oxide. For the material of the white pigment, any one of these examples can be solely used. Alternatively, two or more of these examples may be used in combination.

Lead Frame, Lead

The major part of the lead frame 4 can be a plate-like member which is made by preparing a flat plate of a metal, such as copper, aluminum, gold, silver, tungsten, iron, nickel, cobalt, molybdenum, or the like, or an alloy thereof, and performing various processes, such as pressing (including punching), etching, rolling, etc., on the flat plate. The lead frame 4 may be a multilayer structure of these metals or alloys or, alternatively, may be formed as a single layer. Particularly, a copper alloy whose major constituent is copper (phosphor bronze, copper-iron alloy, etc.) is preferred because it is good in heat dissipation and electrical conductivity. From the viewpoint of improving light extraction efficiency of the light emitting device, it is preferred that a light reflecting film containing silver, aluminum, rhodium, gold, or an alloy thereof is provided on the surface of the lead frame 4, particularly on the surface of the lead 41 which is exposed at the bottom surface of the recessed portions 2. Particularly, silver or a silver alloy is preferable due to its light reflectivity.

Also when ceramic or other material is used for a supporting base of the package 1, it is preferred that the surface of the supporting base is plated with silver or a silver alloy.

First Light Emitting Element, Second Light Emitting Element

The first light emitting element 10b and the second light emitting element 20g can be a semiconductor light emitting element, such as light emitting diode (LED). The semiconductor used in the light emitting element can be a nitride-based semiconductor which contains indium in the light emitting layer ($In_XAl_YGa_{1-X-Y}N$, $0 \leq X$, $0 \leq Y$, $X+Y \leq 1$). When using a nitride-based semiconductor which contains indium in the light emitting layer, the amount of indium contained in the light emitting layer of the green light emitting element is greater than the amount of indium contained in the light emitting layer of the blue light emitting element. Therefore, due to variation in the amount of indium, the emission peak wavelength of the green light emitting element is likely to involve variance as compared with the blue light emitting element. However, according to the present disclosure, even if variance occurs in the emission peak wavelength of the green light emitting element, the chromaticity of the light emitting device can be easily adjusted by adding a predetermined amount of green phosphor and/or a predetermined amount of blue phosphor. As a result, a wide variety of green light emitting elements can be used, and the production yield of the light emitting device is improved such that a low-cost light emitting device can be provided. The planar shape of the first light emitting elements 10b and the second light emitting element 20g may be square, rectangular, hexagonal, or the like. The number and shape of the respective light emitting elements can be appropriately selected according to the shape and size of the package 1.

Light Transmitting Member

The light transmitting member 3 is a member that covers the first light emitting elements 10b and the second light emitting element 20g for protection against dust, moisture, external force, etc. The light transmitting member 3 provides electrical insulation and has high light transmittance for light emitted from the first light emitting elements 10b and the second light emitting element 20g. The light transmitting member 3 includes a base material, and contains the red phosphor 33r and at least one of the green phosphor 31g and the blue phosphor 32b.

Examples of the base material of the light transmitting member 3 include silicone resins, epoxy resins, phenolic resins, polycarbonate resins, acrylic resins, TPX resins, polynorbornene resins, and modified resins and hybrid resins thereof. Among these examples, silicone resins (e.g., silicone resins and modified resins and hybrid resins thereof) have a low elastic modulus and are particularly good in heat resistance and light resistance, while they have relatively-high gas permeability, so that the effects of the present embodiment are likely to be achieved. Among silicone resins, silicone resins containing a phenyl group (e.g., methylphenyl silicone resins and diphenyl silicone resins) are preferred due to their relatively-high heat resistance and gas barrier property.

Green Phosphor

The green phosphor 31g may be a phosphor that can be excited by light emitted from the first light emitting element 10b. The green phosphor 31g is a green phosphor of which the half width of the emission spectrum is not more than 45 nm, more preferably a green phosphor of which the half width of the emission spectrum is not more than 40 nm. This can realize high color reproducibility when a light emitting device of the present disclosure is used as a light source of a liquid crystal display. One of the examples of such a green phosphor 31g is an aluminate phosphor whose composition includes a first element which includes one or more elements selected from Ba and Sr and a second element which includes Mg and Mn.

Blue Phosphor

The blue phosphor 32b used is a blue phosphor of which the half width of the emission spectrum is not more than 60 nm, more preferably a blue phosphor of which the half width of the emission spectrum is not more than 50 nm. This can realize high color reproducibility when a light emitting device of the present disclosure is used as a light source of a liquid crystal display. It is preferable to use a blue phosphor which is capable of absorbing shorter wavelengths of the first light emitting element 10b. This can reduce emission components on the shorter wavelength side, at not more than 435 nm, which can adversely affect a human body, while maintaining the color reproducibility. One of the examples of such a blue phosphor 32b is an alkaline earth halogen apatite-based phosphor.

The amount of the added green phosphor 31g or the added blue phosphor 32b is preferably 1 to 70 wt %, more preferably 1 to 55 wt %.

Red Phosphor

It is preferred that the red phosphor 33r is selected from red phosphors capable of being excited by light from the first light emitting elements 10b. It is also preferred that the red phosphor 33r rarely absorbs green light from the second light emitting element 20g and rarely emits red light. That is, it is preferred that the red phosphor 33r does not substantially convert green light to red light. It is also preferred that the reflectance of the red phosphor 33r for green light is not less than 70% on average within the range of the wavelengths of the green light. The red phosphor 33r can be a phosphor having high reflectance for green light, in other words, a phosphor rarely absorbing green light, further in other words, a phosphor rarely converting the wavelength of green light, thereby allowing the light emitting device to be easily designed. The red phosphor 33r is a red phosphor of which the half width of the emission spectrum is not more than 15 nm, more preferably a red phosphor of which the half width of the emission spectrum is not more than 10 nm.

Examples of such a preferred red phosphor 33r include the following phosphors. The red phosphor 33r can employ at least one or more of the following phosphors. The first type is a red phosphor whose composition is represented by formula (I):

$$A_2MF_6:Mn^{4+} \tag{I}$$

where A is at least one selected from the group consisting of K, Li, Na, Rb, Cs and $NH^{4+}$, and M is at least one element selected from the group consisting of Group IV elements and Group XIV elements.

Group IV elements are titanium (Ti), zirconium (Zr) and hafnium (Hf). Group XIV elements are silicon (Si), germanium (Ge), tin (Sn) and lead (Pb). Specific examples of the first type red phosphor include $K_2SiF_6:Mn^{4+}$, $K_2(Si,Ge)F_6:Mn^{4+}$ and $K_2TiF_6:Mn^{4+}$.

Protection Element

The light emitting device 100 may include a protection element for protecting the light emitting element against static electricity or high-voltage surge. A specific example of the protection element is a Zener diode. The protection element may be covered with a light reflecting member, such as a white resin, in order to prevent or discourage the protection element from absorbing light.

Bonding Member

The bonding member is a member in the form of a paste for mounting the first light emitting element 10b and the second light emitting element 20g to the package 1. Specific examples of the bonding member include a tin-bismuth based solder, tin-copper based solder, tin-silver based solder, gold-tin based solder, and a metal paste of silver, gold, palladium, and the like.

Wire

The wires are conductor lines for connecting an electrode of a light emitting element to an electrode of another light emitting element or to a lead or connection terminal of the package 1. When the first light emitting elements 10b and the second light emitting element 20g are connected in series by a wire as in the light emitting device 100, it is difficult to separately control the respective light emitting elements. Thus, using the present disclosure enables easy adjustment of the chromaticity of the light emitting device, whereas in a conventional light emitting device it is difficult to adjust the chromaticity of the light emitting device. Also, a wire can be used for connection of the protection element. Specific examples include a metal wire of a metal, such as gold, copper, silver, platinum, aluminum, palladium, or an alloy thereof. Particularly, a metal or alloy wire is preferred which is resistant to breakage by stress from the light transmitting member 3, and which is good in thermal resistance. The wires may contain silver or a silver alloy at least on its surface such that the light reflectivity is increased. The diameter of the wires can be selected appropriately but is preferably not less than 5 μm and not more than 50 μm, more preferably not less than 10 μm and not more than 40 μm, still more preferably not less than 15 μm and not more than 30 μm.

While the present invention has been described with respect to exemplary embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A method for manufacturing a light emitting device, comprising:
   providing at least two first light emitting diodes and a second light emitting diode so that the second light emitting diode is interposed between the at least two first light emitting diodes, the at least two first light emitting diodes each having an emission peak wavelength in a range of not less than 430 nm and less than 490 nm, and the second light emitting diode having an emission peak wavelength in a range of not less than 490 nm and not more than 570 nm; and
   providing a light transmitting member in such a manner as to cover the at least two first light emitting diodes and the second light emitting diode, the light transmitting member containing a red phosphor, a green phosphor and a blue phosphor,
   wherein
   the red phosphor has a composition represented by formula (I):

$$A_2MF_6:Mn^{4+} \tag{I}$$

where A is at least one selected from the group consisting of K, Li, Na, Rb, Cs and $NH^{4+}$, and M is at least one element selected from the group consisting of Group IV elements and Group XIV elements,
   the green phosphor is an aluminate phosphor whose composition includes a first element which includes one or more elements selected from the group consisting of Ba and Sr and a second element which includes Mg and Mn, and
   the blue phosphor is an alkaline earth halogen apatite based phosphor.

2. The method according to claim 1, wherein the step of providing the light transmitting member includes adding a predetermined amount of the green phosphor and a predetermined amount of the blue phosphor based on the emission peak wavelength of the second light emitting diode, and wherein
   a chromaticity of the light emitting device is adjusted by the adding step.

3. The method according to claim 2 wherein,
   in the adding step, a y value of the chromaticity of the light emitting device on the 1931 CIE chromaticity diagram is increased by adding the green phosphor and the blue phosphor.

4. The method according to claim 3, wherein
   an amount of the added green phosphor or the added blue phosphor is 1 to 70 wt %.

5. The method according to claim 3, wherein
the method further comprising mounting the at least two first light emitting diodes and the second light emitting diode to a package,
the package includes a lead and a resin portion, the package including a recessed portion, the recessed portion including a bottom surface at which an upper surface of the lead is partially exposed, and
the at least two first light emitting diodes and the second light emitting diode are disposed on the bottom surface of the recessed portion.

6. The method according to claim 3, wherein
a half width of an emission spectrum of the red phosphor is not more than 15 nm.

7. The method according to claim 6, wherein
a half width of an emission spectrum of the green phosphor is not more than 45 nm and a half width of an emission spectrum of the blue phosphor is not more than 60 nm.

8. The method according to claim 1, wherein
an amount of the green phosphor or the blue phosphor is 1 to 70 wt %.

9. The method according to claim 8, wherein
the method further comprising mounting the at least two first light emitting diodes and the second light emitting diode to a package,
the package includes a lead and a resin portion, the package including a recessed portion, the recessed portion including a bottom surface at which an upper surface of the lead is partially exposed, and
the at least two first light emitting diodes and the second light emitting diode are disposed on the bottom surface of the recessed portion.

10. The method according to claim 8, wherein
a half width of an emission spectrum of the red phosphor is not more than 15 nm.

11. The method according to claim 10, wherein
a half width of an emission spectrum of the green phosphor is not more than 45 nm and a half width of an emission spectrum of the blue phosphor is not more than 60 nm.

12. The method according to claim 1, wherein
the method further comprising mounting the at least two first light emitting diodes and the second light emitting diode to a package,
the package includes a lead and a resin portion, the package including a recessed portion, the recessed portion including a bottom surface at which an upper surface of the lead is partially exposed, and
the at least two first light emitting diodes and the second light emitting diode are disposed on the bottom surface of the recessed portion.

13. The method according to claim 12, wherein
a half width of an emission spectrum of the red phosphor is not more than 15 nm.

14. The method according to claim 13, wherein
a half width of an emission spectrum of the green phosphor is not more than 45 nm and a half width of an emission spectrum of the blue phosphor is not more than 60 nm.

15. The method according to claim 1, wherein
a half width of an emission spectrum of the red phosphor is not more than 15 nm.

16. The method according to claim 15, wherein
a half width of an emission spectrum of the green phosphor is not more than 45 nm and a half width of an emission spectrum of the blue phosphor is not more than 60 nm.

17. A light emitting device, comprising:
a package;
at least two first light emitting diodes each having an emission peak wavelength in a range of not less than 430 nm and less than 490 nm;
a second light emitting diode having an emission peak wavelength in a range of not less than 490 nm and not more than 570 nm, the second light emitting diode being interposed between the at least two first light emitting diodes; and
a light transmitting member covering the at least two first light emitting diodes and the second light emitting diode, the light transmitting member containing a red phosphor, a green phosphor and a blue phosphor,
wherein:
the at least two first light emitting diodes and the second light emitting diode being mounted to an upper surface of the package,
the red phosphor has a composition represented by formula (I):

$$A_2MF_6:Mn^{4+} \qquad (I)$$

where A is at least one selected from the group consisting of K, Li, Na, Rb, Cs and $NH^{4+}$, and M is at least one element selected from the group consisting of Group IV elements and Group XIV elements,
the green phosphor is an aluminate phosphor whose composition includes a first element which includes one or more elements selected from the group consisting of Ba and Sr, and a second element which includes Mg and Mn, and
the blue phosphor is an alkaline earth halogen apatite phosphor.

18. The light emitting device according to claim 17, wherein
a half width of an emission spectrum of the red phosphor is not more than 15 nm.

19. The light emitting device according to claim 18, wherein
a half width of an emission spectrum of the green phosphor is not more than 45 nm and a half width of an emission spectrum of the blue phosphor is not more than 60 nm.

20. The light emitting device according to claim 19, wherein
an amount of the green phosphor or the blue phosphor is 1 to 70 wt %.

* * * * *